(12) United States Patent
Krassnitzer et al.

(10) Patent No.: US 9,226,379 B2
(45) Date of Patent: Dec. 29, 2015

(54) PLASMA SOURCE

(75) Inventors: Siegfried Krassnitzer, Feldkirch (AT); Daniel Lendi, Grabs (CH); Juerg Hagmann, Sax (CH)

(73) Assignee: OERLIKON SURFACE SOLUTIONS AG, TRUBBACH, Trubbach (CH)

(*) Notice: Subject to any disclaimer, the term of this patent is extended or adjusted under 35 U.S.C. 154(b) by 0 days.

(21) Appl. No.: 14/343,549

(22) PCT Filed: Aug. 29, 2012

(86) PCT No.: PCT/EP2012/003623
§ 371 (c)(1),
(2), (4) Date: Apr. 10, 2014

(87) PCT Pub. No.: WO2013/034258
PCT Pub. Date: Mar. 14, 2013

(65) Prior Publication Data
US 2014/0217892 A1 Aug. 7, 2014

(30) Foreign Application Priority Data

Sep. 8, 2011 (DE) .......................... 10 2011 112 759

(51) Int. Cl.
*H01J 61/00* (2006.01)
*H05H 1/24* (2006.01)
*H01J 27/02* (2006.01)
*H01J 37/32* (2006.01)

(52) U.S. Cl.
CPC ................ *H05H 1/24* (2013.01); *H01J 27/022* (2013.01); *H01J 37/32045* (2013.01); *H01J 37/32064* (2013.01)

(58) Field of Classification Search
CPC ................ H01J 37/32009; H01J 2237/31701; H01J 37/3266; H01J 17/44; H01J 2237/08; H01J 2237/0815; H01J 2237/0817; H01J 27/02; H01J 27/022; H01J 27/08; H01J 27/14; H01J 27/146; H01J 27/18
See application file for complete search history.

(56) References Cited

U.S. PATENT DOCUMENTS

| 4,301,391 A | * | 11/1981 | Seliger | H01J 37/08 313/231.41 |
| 4,647,818 A | * | 3/1987 | Ham | H01J 3/025 313/231.31 |
| 4,910,435 A | * | 3/1990 | Wakalopulos | H01J 3/021 313/231.31 |
| 5,523,652 A | * | 6/1996 | Sferlazzo | H01J 27/18 313/363.1 |

(Continued)

FOREIGN PATENT DOCUMENTS

| GB | 2 267 387 A | 12/1993 |
| GB | 2 395 286 A | 5/2004 |
| JP | 05-074395 A | 3/1993 |

OTHER PUBLICATIONS

International Search Report issued in Application No. PCT/EP2012/003623 dated Feb. 19, 2013.

*Primary Examiner* — Crystal L Hammond
(74) *Attorney, Agent, or Firm* — Pearne & Gordon LLP

(57) ABSTRACT

The present invention relates to a plasma source which is arranged in floating fashion on a vacuum chamber, wherein the plasma source comprises a source housing, and a filament is provided in the source housing and is arranged so as to be insulated therefrom, wherein means for measuring the potential drop between the source housing and the filament are provided. The measured potential drop can be used for regulating the voltage heating the filament. According to the invention, corresponding means are provided.

7 Claims, 5 Drawing Sheets

(56) References Cited

U.S. PATENT DOCUMENTS

| | | | | |
|---|---|---|---|---|
| 6,137,231 A | * | 10/2000 | Anders | H05H 1/24 118/723 E |
| 6,211,622 B1 | * | 4/2001 | Ryoji et al. | H01J 37/32009 118/723 HC |
| 6,388,381 B2 | * | 5/2002 | Anders | H05H 1/24 118/723 DC |
| 7,038,389 B2 | * | 5/2006 | Madocks | H01J 37/3405 118/723 MW |
| 7,138,768 B2 | * | 11/2006 | Maciejowski | H01J 27/022 250/427 |
| 7,327,089 B2 | * | 2/2008 | Madocks | H01J 27/146 118/723 DC |
| 7,411,352 B2 | * | 8/2008 | Madocks | C23C 14/32 118/723 E |
| 2002/0056814 A1 | | 5/2002 | Sakai | |
| 2003/0193295 A1 | * | 10/2003 | Kaufman | H01J 27/14 315/111.81 |
| 2006/0151786 A1 | | 7/2006 | Nakanishi | |
| 2009/0309509 A1 | | 12/2009 | Geissler | |

* cited by examiner

PLASMA SOURCE

The present invention relates to a plasma source according to the preamble of claim 1. The invention also relates to a method for generating plasma by means of a thermionic discharge.

In this connection, a filament is heated by means of current, which results in the emission of electrons from the hot surface of the filament. The electron emission from hot surfaces follows the law first described by Richardson:

$$J = A_G T^2 e^{-W/kT}$$

where J is the emission current density, T is the temperature and W is the work function of the electrons.

If the surface of the filament reaches a temperature which is grater than approx. 2900 K for tungsten, sufficient electrons are emitted from the surface so that with their help, as soon as they are sufficiently accelerated due to a voltage, argon gas is ionized to such an extend that plasma can be maintained.

According to the state of the art, the heating of the filament is achieved over a constant current strength. If an AC voltage is applied, a phase cut control allows the effective value of the current to be regulated. When operating under high temperatures, the filament material (e.g. tungsten) evaporates, which results in the wire diameter of the filament being reduced. Consequently, the resistance of the filament as defined by the wire will increase. If the heater current remains unchanged, a stronger heating will ensue and thus an accelerated evaporation of the filament material. Within a short time, this results in a melting through. FIG. 1a shows the diameter of the filament depending on the duration of operation at constant heater current. Accordingly, FIG. 1b shows the filament temperature depending on the duration of operation at constant heater current. It can be clearly seen that after an initially constant reduction of the wire diameter, the filament burns through quickly (pinch-through effect).

The present invention has the task of providing a method with which such a fast burning through can be avoided and thus the duration of operation, i.e. the filament's service life, can be increased.

During their experiments to increase the service life, the inventors have noticed on the one hand that at a temperature of the filament wire that is maintained constant, the wire diameter is reduced at a nearly constant rate. FIG. 2 shows the evolution of the wire diameter depending on the duration of operation of the filament, at a constant temperature and in comparison with a measurement at constant current strength.

In their experiments, the inventors on the other hand have surprisingly noticed that when operating at a constant drop of potential between the filament and the plasma, the temperature of the filament remains nearly constant and the evaporation rate even decreases when the filament diameter decreases as shown in FIGS. 3a and 3b, respectively.

According to the invention, the filament is thus operated not at constant current strength but at constant voltage.

BRIEF DESCRIPTION OF THE DRAWINGS

The invention will now be described in detail on the basis of the figures by way of example. FIG. 4 shows a plasma source according to the state of the art, which is placed on a vacuum chamber 1. The plasma source comprises a source housing 3 with an net 5 for argon gas. In the source housing 3, a filament 9 is provided that is connected to a transformer 13 via openings 11 insulated from the source housing 3. The filament 9 consists in the example of a tungsten wire with a diameter of 2 mm. The transformer is operated in the example with an AC voltage of 50 Hz. A heater current of approx. 200 A flows through the filament 9. If the surface of the filament 9 reaches a temperature greater than 2900 K, a sufficient number of electrons are emitted from the filament surface which, when a discharge voltage is applied by means of a voltage source 15 between the vacuum chamber 15 and the transformer 13, the argon gas flowing through the net 5 into the inside of the source housing 3 can ionize. The ignition of the discharge occurs in the first moment over a resistance that connects the source housing 3 with the mass (not shown). If there are enough load carriers the discharge current can also be lead through the opening 17 (also called "orifice") into the vacuum chamber 1.

Figure 1A:
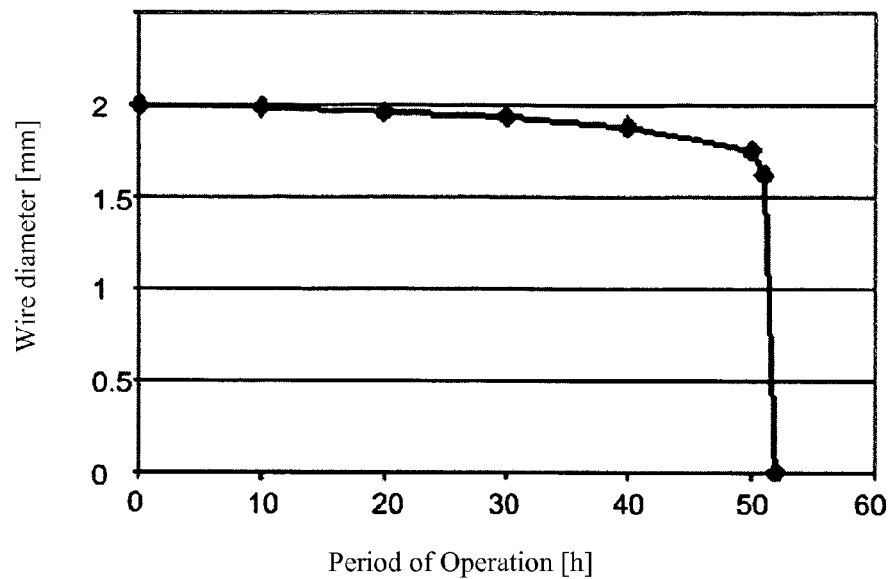
FIG. 1a shows the diameter of a filament depending on the duration of operation at constant heater current.
Figure 1B:
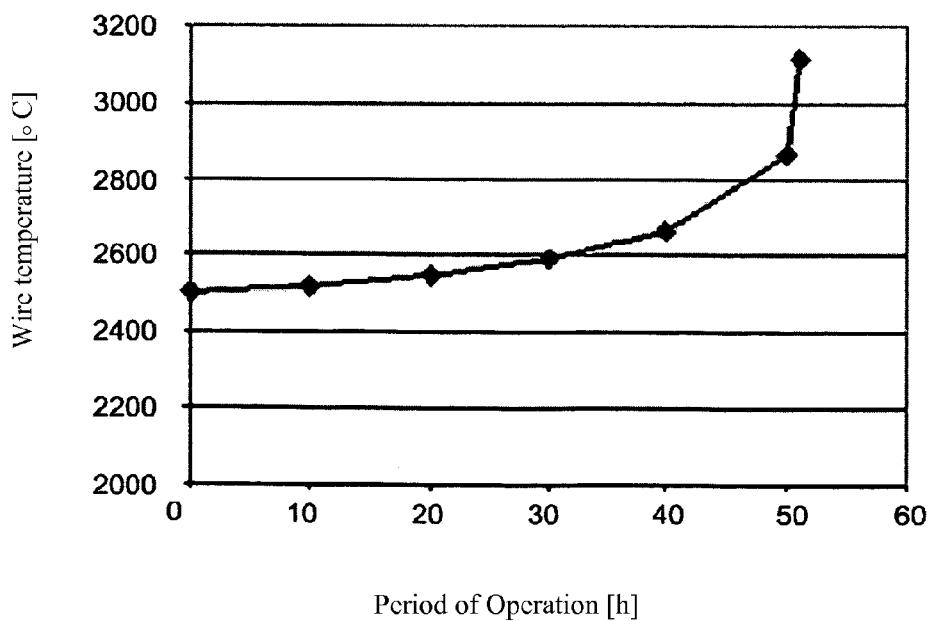
FIG. 1b shows the filament temperature depending on the duration of operation at constant heater current.
Figure 2:
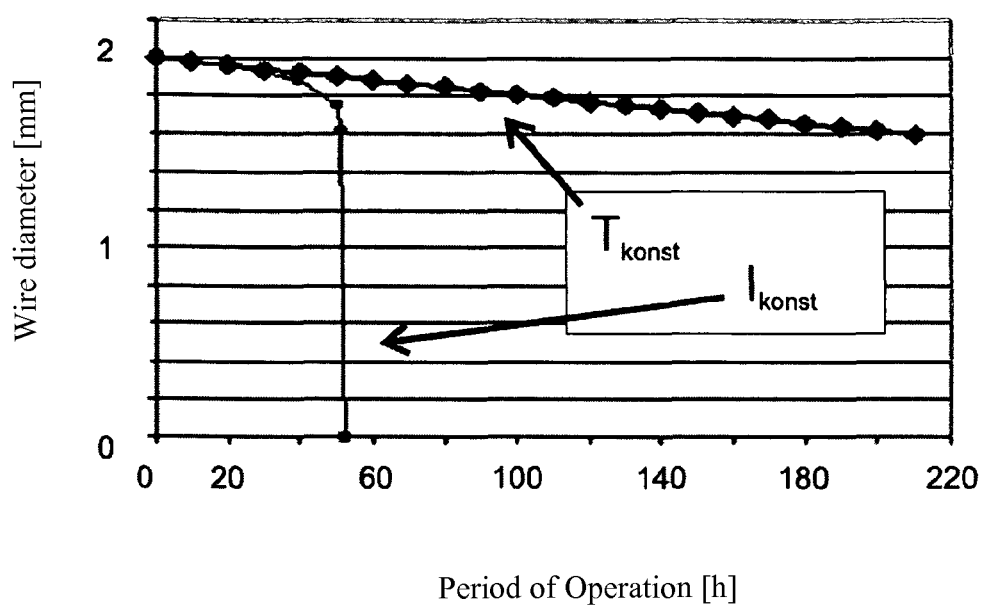
FIG. 2 shows the evolution of the wire diameter depending on the duration of operation of the filament at constant temperature in comparison with a measurement at constant current.
Figure 3A:
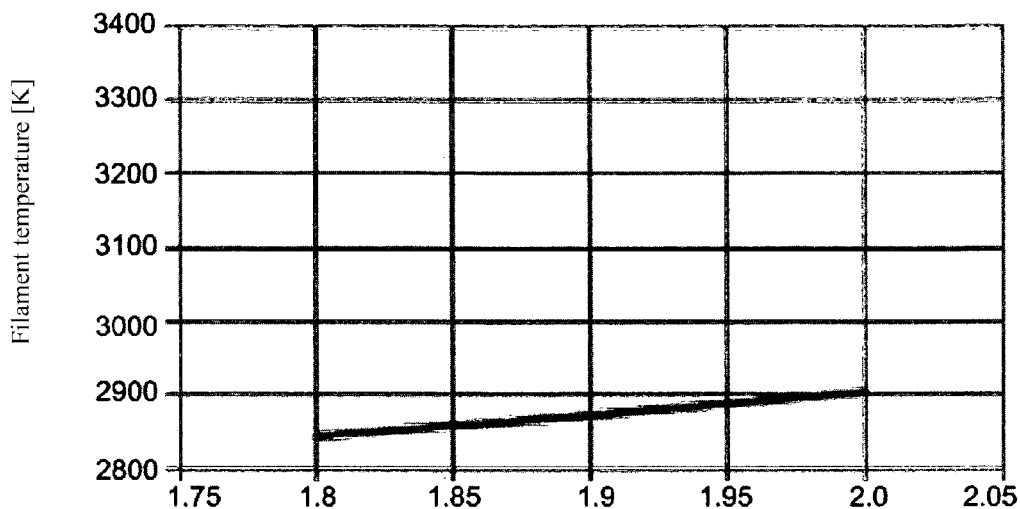
FIG. 3a shows filament temperature as a function of filament diameter.
Figure 3B:
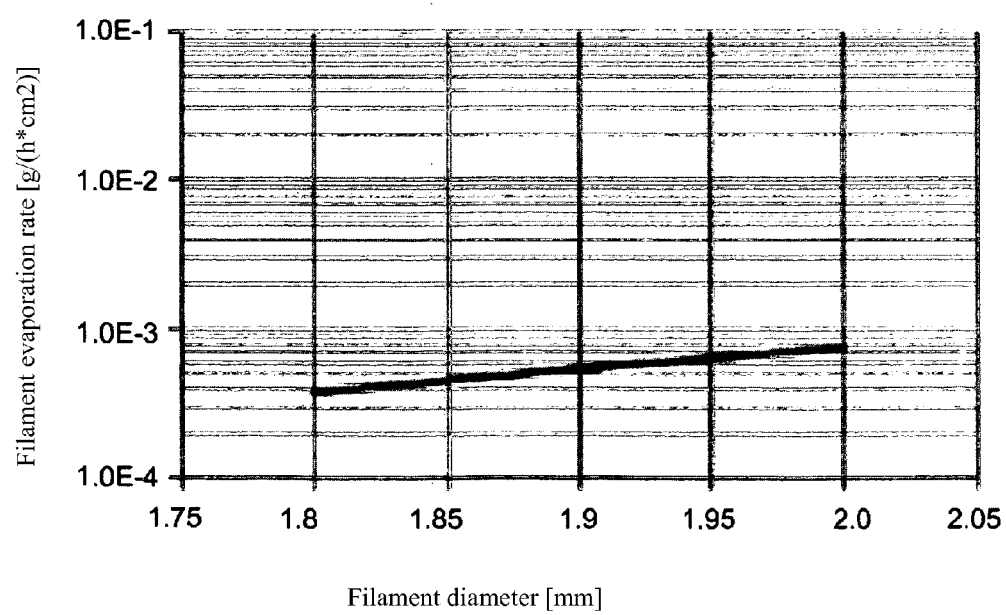
FIG. 3b shows filament evaporation rate as a function of filament diameter.
Figure 4:
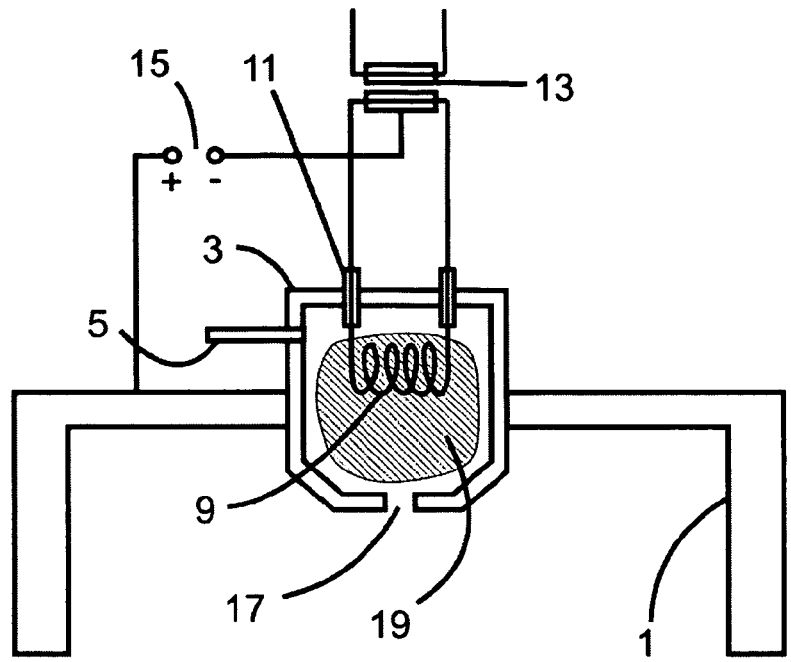
FIG. 4 shows a plasma source according to the state of the art.
Figure 5:
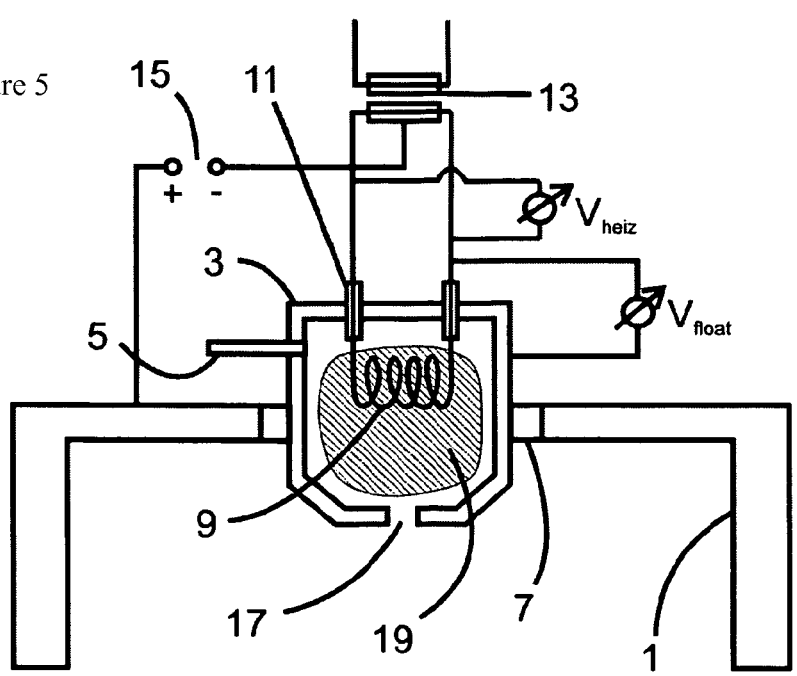
FIG. 5 shows a plasma source according to the invention.

According to the invention, the source housing as represented in FIG. 5, electrically insulated by means of the insulation 7, is arranged on the vacuum chamber 1 and the voltage between the source housing 3 held in floating potential and the supply line to the filament 9 is measured. The filament 9 is heated through a current I. At the filament, a voltage $V_{heiz}$, which can be adjusted by means of the transformer 13, drops. After the source body 3 has been mounted in an electrically floating manner, the inventive potential measurement between the supply line designated as cathode and the source housing can be assessed as characteristic for the state of the potential drop between the filament 9 and plasma 19 ignited inside the source housing, and thus for the state of the exit of electrons from the filament. According to the invention, this state is maintained essentially constant, for example by regulating the heater voltage $U_{heiz}$. The measurement of $V_{float}$ thus enables the optimum state for the electron emission to be maintained. In this manner, the temperature of the filament can be maintained at an optimum. Optimum in this connection means that at this temperature, the evaporation rate of the filament material is acceptably low, yet sufficiently high to ensure a sufficiently high emission of electrons for maintaining the plasma. This makes it possible to considerably increase the lifespan of the filament, i.e. its service life, as compared with the state of the art.

According to one embodiment of the present invention, plasma source arrangements for heating and plasma etching of substrates can include a plurality of plasma sources that function according to the principle of thermionic emission. The filaments of the plasma sources are heated through applied voltages, wherein according to the invention the applied voltages are regulated in such a manner that the voltage between the filament and the floating source housing achieves a preferably essentially constant value between 0V and −10V.

Preferably, the heating takes place through a switched-mode power supply. According to this embodiment, source coils are provided at the individual plasma sources. The plasma in the processing chamber is distributed over the processing height through the combination of the magnetic field of an external coil and of the magnetic fields of the source coils over the processing height. The processing chamber and/or a floating insulated anode can serve as discharge anode.

Figure 6:
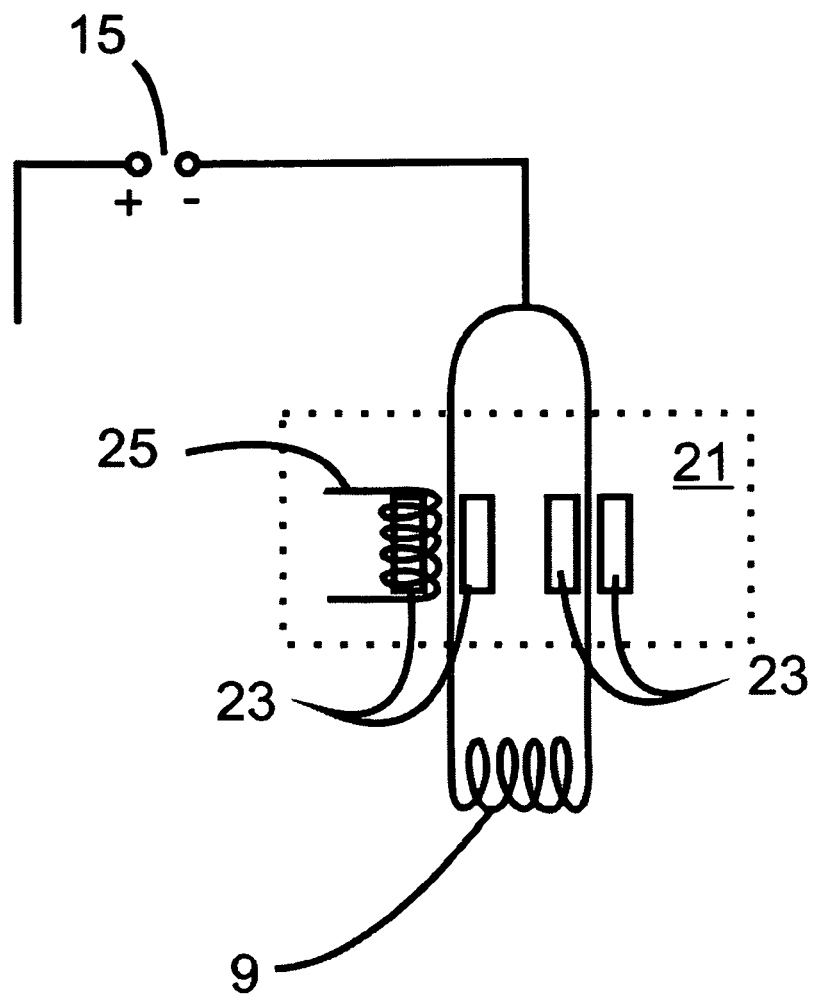
FIG. 6 shows a switch-mode power supply.

According to a further embodiment of the present invention, the transformer 13 is replaced by a so-called switched-mode power supply 21, as represented in FIG. 6. Such a switched-mode power supply 21 comprises a ferrite core 23 around which windings of a primary coil 25 are wound (shown for only one part of the ferrite core), whilst the supply lines to the filament for example merely form a loop. According to the invention, a ferrite core is provided on both supply lines to the filament and the discharge voltage $V_{Disc}$ is applied centrally on the side opposite the filament 9. In this manner, i.e. by means of the switched-mode power supply, a very small and compact plasma source can be achieved.

What is claimed is:

1. Plasma source on a vacuum chamber for generating a plasma in the vacuum chamber, wherein the plasma source comprises a source housing with an opening protruding into the vacuum chamber and wherein, in the source housing, a filament is provided to which a heater voltage ($V_{heiz}$ or $U_{heiz}$) can be applied to the filament through supply lines that pass through insulated via openings formed in the source housing, so that the filament can be heated by means of a current flow, characterized in that the source housing is placed on the vacuum chamber in a manner electrically insulated therefrom, and in that means are provided for measuring a potential drop ($V_{float}$ or $U_{float}$) between a supply line to the filament and the source housing that represents the state of the potential drop between the filament and a plasma ignited inside the source housing, and thus for the state of the emission of electrons from the filament, and means are provided for regulating the heater voltage ($V_{heiz}$ or $U_{heiz}$) that are configured to process the measured value of potential drop ($V_{float}$ or $U_{float}$) as control signal in order to adjust the state for the electron emission to be maintained.

2. Device with a plurality of plasma sources according to claim 1, characterized in that the plasma sources are surrounded respectively by at least one source coil and the plasma sources are surrounded by an outer coil comprising several plasma sources extending above the processing height.

3. Device according to claim 1, characterized in that the heater voltage is fed by means of at least one switched-mode power supply, wherein a discharge voltage ($V_{disc}$ or $U_{disc}$) required for the discharge is applied centrally and opposite the filament.

4. Method for generating a plasma in a vacuum chamber, the method comprising:
   placing a plasma source with a source housing and a filament in the source housing on the vacuum chamber,
   applying a heater voltage ($V_{heiz}$ or $U_{heiz}$) to the filament to heat the filament by means of a current flow,
   maintaining the source housing opposite the vacuum chamber and on a floating potential,
   measuring a potential drop ($V_{float}$ or $U_{float}$) between a supply line to the filament and the source housing inside which a plasma is burning and
   using the measured potential drop for regulating a heater voltage ($V_{heiz}$ or $U_{heiz}$) applied to the filament,
   wherein the heater voltage results in a current heating the filament and thus in an emission of electrons.

5. Method according to claim 4, characterized in that the heater voltage is regulated in such a manner that the potential drop between the source housing and the filament is essentially maintained constant.

6. Method according to claim 4, characterized in that the potential drop between the source housing and the filament is maintained at values between 0V and −10V.

7. Method according to claim 4, characterized in that the floating potential comprises an electrically floating manner.

* * * * *